US009958532B2

(12) United States Patent
Burger (10) Patent No.: US 9,958,532 B2
(45) Date of Patent: May 1, 2018

(54) ELECTRODE CONFIGURATION FOR POSITION DETECTION AND METHOD FOR POSITION DETECTION

(71) Applicant: Microchip Technology Germany II GMBH & CO. KG, Gilching (DE)

(72) Inventor: Stefan Burger, Munich (DE)

(73) Assignee: Microchip Technology Germany II GMBH & CO. KG, Gilching (DE)

( * ) Notice: Subject to any disclaimer, the term of this patent is extended or adjusted under 35 U.S.C. 154(b) by 0 days. days.

(21) Appl. No.: 14/346,959

(22) PCT Filed: Sep. 20, 2012

(86) PCT No.: PCT/EP2012/068579
§ 371 (c)(1),
(2) Date: Mar. 24, 2014

(87) PCT Pub. No.: WO2013/041645
PCT Pub. Date: Mar. 28, 2013

(65) Prior Publication Data
US 2015/0123682 A1   May 7, 2015

(30) Foreign Application Priority Data

Sep. 23, 2011   (DE) .......................... 10 2011 083 336

(51) Int. Cl.
*G01S 5/02* (2010.01)
*G06F 3/044* (2006.01)
(Continued)

(52) U.S. Cl.
CPC .............. *G01S 5/0268* (2013.01); *G01D 5/24* (2013.01); *G06F 3/044* (2013.01); *H03K 17/962* (2013.01); *H03K 2217/96066* (2013.01)

(58) Field of Classification Search
CPC .............. G01S 5/02; G01D 5/24; G01R 27/26
See application file for complete search history.

(56) References Cited

U.S. PATENT DOCUMENTS 4,879,508 A * 11/1989 Andermo ............... G01B 7/003
324/660
5,136,286 A    8/1992 Veneruso ................. 340/870.37
(Continued)

FOREIGN PATENT DOCUMENTS

DE          4009977 A1    10/1990   ............... G01B 7/02
DE       19503203 A1     8/1995   ............... B60N 2/00
(Continued)

OTHER PUBLICATIONS

Math is fun, Acute Angles.*
(Continued)

*Primary Examiner* — Jermele M Hollington
*Assistant Examiner* — Alvaro Fortich
(74) *Attorney, Agent, or Firm* — Slayden Grubert Beard PLLC (57) ABSTRACT

Provided is a method for detecting a position of an object relative to an electrode configuration with at least three electrodes, wherein a first electrode substantially is arranged parallel or concentrically to a second electrode, a third electrode is arranged in an acute angle or excentric relative to the first electrode, the first electrode is loaded with a first generator signal, and wherein the second electrode may be loaded with a second generator signal. The second generator signal preferably is inverse with respect to the first generator signal. In addition, provided for the method is a suitable electrode configuration with at least three electrodes.

39 Claims, 4 Drawing Sheets

(51) Int. Cl.
*H03K 17/96* (2006.01)
*G01D 5/24* (2006.01)

(56) References Cited

U.S. PATENT DOCUMENTS

| | | | | |
|---|---|---|---|---|
| 5,333,390 | A | 8/1994 | Petterson et al. ............... | 33/706 |
| 6,452,514 | B1* | 9/2002 | Philipp ................ | G01D 5/2405 |
| | | | | 178/18.06 |
| 7,218,124 | B1 | 5/2007 | Mackey et al. ............... | 324/660 |
| 7,808,255 | B2* | 10/2010 | Hristov ................... | G06F 3/044 |
| | | | | 324/660 |
| 8,648,819 | B2 | 2/2014 | Philipp ........................ | 345/173 |
| 8,710,623 | B1* | 4/2014 | Mayder .................. | H01L 25/16 |
| | | | | 257/532 |
| 2001/0025177 | A1* | 9/2001 | Woloszko ................. | A61B 18/12 |
| | | | | 606/41 |
| 2002/0115196 | A1* | 8/2002 | Boven .................... | C12M 35/02 |
| | | | | 435/287.1 |
| 2005/0270039 | A1 | 12/2005 | Mackey ........................ | 324/660 |
| 2007/0132737 | A1* | 6/2007 | Mulligan .................. | G06F 3/0418 |
| | | | | 345/173 |
| 2008/0231290 | A1* | 9/2008 | Zhitomirsky .......... | G01F 23/261 |
| | | | | 324/661 |
| 2009/0125016 | A1* | 5/2009 | Wang .................. | A61B 18/1492 |
| | | | | 606/41 |
| 2009/0184920 | A1 | 7/2009 | Francis ........................ | 345/156 |
| 2010/0147600 | A1 | 6/2010 | Orsley ..................... | 178/180.03 |
| 2010/0289774 | A1* | 11/2010 | Pan .......................... | G06F 3/044 |
| | | | | 345/175 |
| 2010/0292945 | A1* | 11/2010 | Reynolds ................ | G06F 3/044 |
| | | | | 702/65 |
| 2010/0295564 | A1* | 11/2010 | Reynolds ................ | G06F 3/044 |
| | | | | 324/686 |
| 2010/0321043 | A1* | 12/2010 | Philipp ................... | G06F 3/044 |
| | | | | 324/686 |
| 2011/0017523 | A1 | 1/2011 | Bulea et al. ............... | 178/18.06 |
| 2011/0062971 | A1* | 3/2011 | Badaye ................... | G06F 3/044 |
| | | | | 324/686 |
| 2011/0084857 | A1* | 4/2011 | Marino ................... | G06F 3/044 |
| | | | | 341/5 |
| 2011/0148435 | A1* | 6/2011 | Schwartz .............. | G06F 3/0416 |
| | | | | 324/658 |
| 2011/0169506 | A1* | 7/2011 | Aubauer ................. | F24C 7/082 |
| | | | | 324/633 |
| 2012/0283972 | A1* | 11/2012 | Vandermeijden ..... | G06F 3/0416 |
| | | | | 702/65 |
| 2012/0327012 | A1* | 12/2012 | Hoch ...................... | G06F 3/044 |
| | | | | 345/174 |

FOREIGN PATENT DOCUMENTS

| | | | | |
|---|---|---|---|---|
| DE | 69308669 T2 | 9/1997 | ............. | G01B 7/02 |
| GB | 2286247 A | 8/1995 | ............... | B60N 2/00 |
| JP | 06341805 A | 12/1994 | ............... | G01B 7/00 |
| JP | 2007299409 A | 11/2007 | ............... | G06F 3/041 |
| WO | 2013/041645 A1 | 3/2013 | ............. | G06F 3/044 |

OTHER PUBLICATIONS

International Search Report and Written Opinion, Application No. PCT/EP2012/068579, 7 pages, dated Feb. 7, 2013.
Japanese Office Action, Application No. 2014531239, 15 pages, dated Jun. 17, 2016.
Taiwan Office Action, Application No. 101134330, 14 pages, dated Apr. 7, 2016.
Chinese Office Action, Application No. 201280046443.3, 6 pages, dated Apr. 21, 2016.
European Office Action, Application No. 12774971.1, 8 pages, dated Jan. 25, 2017.
German Office Action, Application No. 102011083336.6, 9 pages, dated Mar. 20, 2017.
Chinese Office Action, Application No. 201280046443.3, 5 pages, dated Nov. 29, 2016.

* cited by examiner

ELECTRODE CONFIGURATION FOR POSITION DETECTION AND METHOD FOR POSITION DETECTION

CROSS-REFERENCE TO RELATED APPLICATIONS

This application is a U.S. National Stage Application of International Application No. PCT/EP2012/068579 filed Sep. 20, 2012, which designates the United States of America, and claims priority to DE Patent Application No. 10 2011 083 336.6 filed Sep. 23, 2011. The contents of which are hereby incorporated by reference in their entirety.

TECHNICAL FIELD

The invention relates to an electrode configuration for a capacitive sensor system, in particular for detecting a position of an object relative to the electrode configuration, as well as a method for detecting a position of an object relative to the electrode configuration.

BACKGROUND

In capacitive sensor systems, in particular capacitive approach sensors, the approach of an object towards a sensor zone substantially is measured contactless by means of generation and measurement of electric alternating fields.

Derived from the measurement signal may be functions, for example switching functions, of an electric device, in particular an electric handheld device.

For example, there exists a need to provide sensor zones of a capacitive sensor system at an electric handheld device, wherein during an approach of an object towards a sensor zone not only the approach of the object towards the sensor zone is detectable but also the position of the object relative to the sensor zone.

Depending on the position of the object relative to the sensor zone different functions may be carried out in the electric handheld device. In doing so, it is desired to achieve a preferably high position resolution. To accomplish that the capacitive sensor system may be used in different electronic devices it is further desired that the capacitive sensor system preferably is independent of the grounding state of the respective electronic device.

Known from prior art are electrode configurations, in particular for capacitive sensor systems, which function according to the so called loading method, wherein, for example for implementing a sliding controller (in a sliding controller it is important that the position of an object, for example of a finger, may be detected along the sliding controller) a plurality of sensor electrodes arranged side by side and adjacent to each other, respectively, is provided. During operation of the capacitive sensor using a loading method only one sensor electrode is required, which represents a transmitting electrode as well as a receiving electrode.

The sensor electrode is loaded with an electric alternating signal, so that an electric alternating field is emitted therefrom, wherein the capacitive load of the sensor electrode (for example by an approach of a finger towards the sensor electrode) is detected and evaluated, respectively, by means of an evaluation device. By means of the detected capacitive load it may be determined at which sensor electrode an approach of the finger has taken place.

However, such capacitive sensor systems have the disadvantage that very many electrodes are required for a high resolution (position resolution), which significantly increases the constructive effort in the manufacturing process of a sliding controller, for example. In addition, the sensor signal depends on the grounding state of the sensor electronics.

Furthermore, capacitive sensor systems are known, which also have a large number of sensor electrodes, wherein it is required for an exact detection of the position that, for example, a finger covers several sensor electrodes at the same time when contacting the sensor electrodes. Again, because of the large number of sensor electrodes required for a high position resolution the constructive effort for the manufacturing process is increased significantly.

SUMMARY

According to various embodiments, an electrode configuration for a capacitive sensor device can be provided for detecting a position of an object relative to the electrode arrangement, as well as a method for detecting a position of an object relative to a electrode configuration, which at least partially avoid the disadvantages known from conventional systems and which allow for a high position resolution with a low number of sensor electrodes, wherein the detection of the position is independent of a grounding state of an electric device for which the capacitive sensor device is provided.

According to various embodiments an electrode configuration for a capacitive sensor system and a method for detecting a position of an object relative to an electrode configuration can be provided. An integral part according to a further embodiment is an electric device, in particular an electric handheld device, which has at least one such capacitive sensor system comprising at least one electrode configuration.

According to that, provided is a method for detecting a position of an object relative to an electrode configuration comprising at least three electrodes, wherein a first electrode is arranged parallel or concentrically with respect to a second electrode, a third electrode is arranged in an acute angle or excentric relative to the first electrode, the first electrode is loaded with a first generator signal, and wherein for determining an exposure of the electrode configuration by the object the second electrode is operated as receiving electrode and the third electrode may be loaded with a second generator signal, wherein at the receiving electrode a first measurement signal is tapped, which is representative for a first coupling capacity between the receiving electrode and the first electrode, and for determining the position the third electrode is operated as a receiving electrode and the second electrode may be loaded with the second generator signal, wherein at the receiving electrode a second measurement signal is tapped, which is representative for a second coupling capacity between the receiving electrode and the first electrode, and wherein the position is determined from the ratio of the variation of the second coupling capacity to the variation of the first coupling capacity.

Preferably, the second generator signal is inverse with respect to the first generator signal.

Prior to determining the position it is detected whether the first coupling capacity falls below a predetermined value, wherein the position only then is determined, when the first coupling capacity falls below the predetermined value.

The variation of the first coupling capacity substantially is proportional to the exposure of the electrode arrangement by the object, and the variation of the second coupling capacity substantially is proportional to the product of exposure and position of the object relative to the electrode arrangement.

Preferably, the variation of the first coupling capacity and the variation of the second coupling capacity each are determined as a variation with respect to the respective coupling capacity in the basic state of the electrode configuration.

In addition, provided is an electrode configuration for a capacitive sensor system, in particular for detecting a position of an object relative to the electrode arrangement, wherein the electrode configuration has a first position detection electrode arrangement that comprises a first electrode and a second electrode, wherein the first electrode is operable as a transmitting electrode and the second electrode is operable as a receiving electrode, wherein the first electrode is arranged in an acute angle relative to the second electrode, and wherein the first electrode may be loaded with a first generator signal.

The electrode configuration further may have at least one exposure detection electrode arrangement, which comprises a third electrode and a fourth electrode, wherein the third electrode may be operated as transmitting electrode and may be loaded with the first generator signal.

The third electrode of the exposure detection electrode arrangement may be formed by the first electrode of the position detection electrode arrangement (common electrode of the exposure detection electrode arrangement and of the position detection electrode arrangement).

The electrode configuration further may comprise a second position detection electrode arrangement, which comprises a fifth electrode and a sixth electrode, wherein the fifth electrode is arranged in an acute angle relative to the sixth electrode.

The second electrode of the first position detection electrode arrangement may be arranged substantially parallel with respect to the fifth electrode of the second position detection electrode arrangement.

The sixth electrode of the second position detection electrode arrangement is formed by the second electrode of the first position detection electrode arrangement (common electrode of the first position detection electrode arrangement and of the second position detection electrode arrangement), wherein the fifth electrode may be operated as transmitting electrode and may be loaded with the first generator signal.

The second electrode of the first position detection electrode arrangement substantially may be arranged concentrically with respect to the fifth electrode of the second position detection electrode arrangement.

The third electrode substantially may be arranged parallel to the fourth electrode.

The second electrode or the fourth electrode or the sixth electrode may be loaded with a second generator signal, wherein the electrodes not loaded with a generator signal are operable as receiving electrodes.

Preferably, the second generator signal is formed inverse with respect to the first generator signal.

The electrode loaded with the first or second generator signal is coupled with at least one receiving electrode via a coupling capacity $C_{Comp}$, wherein the coupling capacity is configured as a discrete capacitor or as a conductor path coupling.

In an further embodiment the electrode configuration comprises three electrodes, wherein a first electrode and a second electrode substantially are arranged parallel to one another, and wherein a third electrode is arranged in an acute angle relative to the first electrode and/or the second electrode.

The third electrode may be arranged between the first electrode and the second electrode, wherein the third electrode is arranged in an acute angle relative to the first electrode and the second electrode.

In an embodiment the first electrode and the second electrode are operable as transmitting electrodes and the third electrode is operable as receiving electrode, wherein the first electrode may be loaded with a first generator signal and the second electrode may be loaded with a second generator signal.

In a further embodiment the second electrode and the third electrode are operable as transmitting electrodes and the first electrode is operable as receiving electrode, wherein the second electrode may be loaded with the first generator signal and the third electrode may be loaded with the second generator signal.

The first generator signal may be inverse with respect to the second generator signal.

In a further embodiment the electrode configuration comprises four electrodes, wherein a first electrode and a second electrode substantially are arranged parallel with respect to each other, wherein a third electrode is arranged in an acute angle relative to the first electrode and/or the second electrode, and wherein a fourth electrode is arranged in an acute angle relative to the third electrode.

In an embodiment, the second electrode and the fourth electrode are operable as transmitting electrodes and the first electrode is operable as receiving electrode, wherein the second electrode may be loaded with a first generator signal and the fourth electrode may be loaded with a second generator signal.

In a further embodiment the second electrode and the fourth electrode are operable as transmitting electrodes and the third electrode is operable as receiving electrode, wherein the second electrode may be loaded with the first generator signal and the fourth electrode may be loaded with the second generator signal.

The first generator signal may be inverse with respect to the second generator signal.

In a further embodiment the electrode configuration comprises four electrodes, wherein a first electrode and a second electrode substantially are arranged parallel to one another, wherein a third electrode is arranged in an acute angle relative to the first electrode, and wherein a fourth electrode is arranged in an acute angle relative to the second electrode. The first electrode and a second electrode are arranged between the third electrode and the fourth electrode.

In an embodiment the third electrode and the fourth electrode are operable as transmitting electrodes, and the first electrode and the second electrode are operable as receiving electrodes, wherein the third electrode may be loaded with a first generator signal and the fourth electrode may be loaded with a second generator signal.

The first generator signal may be inverse with respect to the second generator signal.

In addition, an electric device can be provided according to an embodiment, in particular an electric handheld device, which at least comprises a capacitive sensor system that comprises an electrode configuration.

The electric device and the electric handheld device, respectively, may be a smart phone, a mobile radio unit, a computer mouse, a device remote control, a digital camera, a game controller, a mobile mini-computer, a tablet-PC, a dictating machine, a media player or the like.

BRIEF DESCRIPTION OF THE DRAWINGS

Details and characteristics of various embodiments as well as concrete exemplary embodiments result from the following description in combination with the drawing.

DETAILED DESCRIPTION

The sensor system according to various embodiments for detecting a position of an object relative to an electrode arrangement of the sensor system is configured as a capacitive sensor, which is operated in the operating mode "absorption".

In addition, the sensor system according to various embodiments is configured such that the sensor signals of the sensor system provide two informations:

1. how large is the sensor surface area of the electrode configuration and how large is the sensor length, respectively, which a user covers with his/her finger, and
2. at which position has the user contacted the electrode configuration with his/her finger.

Figure 1:
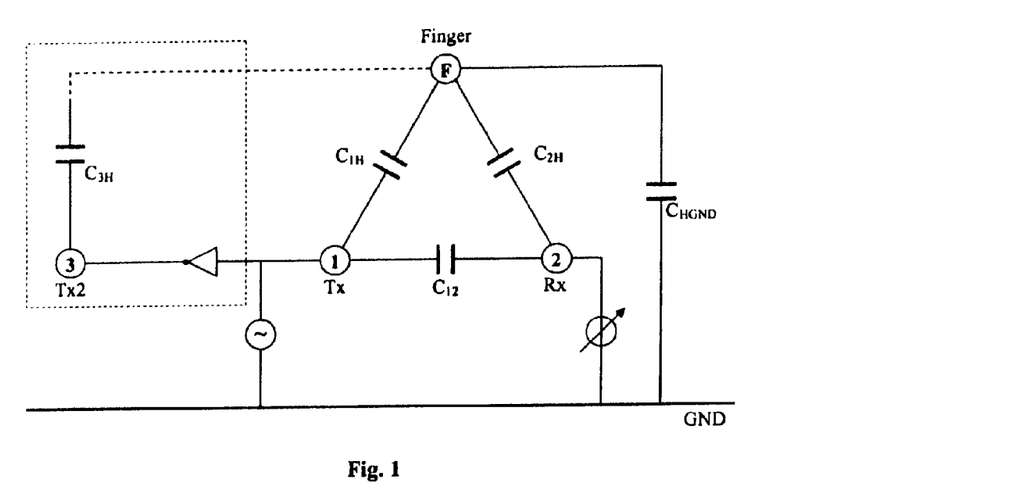
FIG. 1 shows an equivalent circuit diagram of a capacitive sensor system for illustrating the absorption effect.

FIG. 1 shows an equivalent circuit diagram of a capacitive sensor system for illustrating the absorption effect and for illustrating the measures by which the sensor system is made independent of the grounding state of the sensor system.

The electrodes Tx (transmitting electrode) and Rx (receiving electrode) are arranged adjacent to each other, so that a basic capacitive coupling $C_{12}$ is formed between them. During an approach of a hand or of a finger F towards the electrodes Tx, Rx the basic capacitive coupling $C_{12}$ becomes smaller (absorption), so that the electric current flowing through $C_{12}$ becomes smaller as well.

The capacitive coupling between the electrode Tx and the finger F is denoted by $C_{1H}$, the capacitive coupling between Rx and the finger is denoted by $C_{2H}$. During an approach of the finger F towards the electrodes Tx, Rx the coupling capacities $C_{1H}$ and $C_{2H}$ become larger. Produced from that and parallel to $C_{12}$ is a current path between the electrode Tx and the electrode Rx that may be interpreted as transmission.

This current path parallel to $C_{12}$ has to be reduced, preferably has to be inhibited by means of suitable measures, as described in the following:

a) It may be attempted to make $C_{HGND}$ (the capacitive coupling between the finger F and ground GND) significantly larger than $C_{1H}$ (or to firmly connect the finger F with ground GND). In doing so, substantially it is achieved that the current flowing from electrode Tx via $C_{1H}$ to finger F does not flow via $C_{2H}$ to electrode Rx. Thereby, the transmission Tx→Rx is largely avoided, however, the sensor system still depends on the grounding conditions of the sensor system.

b) In addition, provided is a second transmitting electrode Tx2, which mainly may be brought into a capacitive coupling $C_{3H}$ with the approaching finger F. The second transmitting electrode Tx2 preferably is arranged relative to the receiving electrode Rx such that the capacitive coupling between the second transmitting electrode Tx2 and the receiving electrode Rx is neglectable. The second transmitting electrode Tx2 is loaded with a generator signal, which preferably is inverse with respect to the generator signal applied to the first transmitting electrode Tx. Thereby it is substantially accomplished that the current flowing from electrode Tx via $C_{1H}$ to finger F directly discharges via $C_{3H}$. A further flow to electrode Rx via $C_{2H}$ of the current flowing from electrode Tx via $C_{1H}$ to finger F such is avoided. In the embodiment of the electrodes it has to be considered that the coupling capacities $C_{1H}$ and $C_{3H}$ substantially are equal. This may be accomplished by an approximately equal electrode width of the first electrode Tx and the second electrode Tx2. In doing so, the sensor system also is independent of the grounding conditions of the sensor system.

In order to accomplish that the sensor system is largely independent of the grounding state in the preferred embodiment two transmitting electrodes +Tx (in FIG. 1 denoted by Tx) and −Tx (in FIG. 1 denoted by Tx2) are operated at the same time, wherein the transmitting signals and the generator signals, respectively, which are applied to the electrodes +Tx and −Tx, are inverse with respect to each other, i.e. the sum of the alternating portions of the electrode signals +Tx and −Tx equals zero.

By means of the layout of the sensor system and the electrodes, respectively, it is ensured that during contacting the capacitive coupling between +Tx and the finger F of the user ideally is equal in size as the capacitive coupling between −Tx and the finger F. Thereby, the coupling +Tx→F substantially is neutralized by the coupling −Tx→F.

In non-grounded measurement electronics it is avoided by means of this design that a current flows from the finger of the user to electrode Rx (transmission) and thereby distorts the measurement signal of the absorption.

In grounded measurement electronics, due to the design, the current flowing from finger F of the user to electrode Rx (transmission) is neglectably small, so that it is ensured that independent of the grounding state no transmission current is flowing. In doing so, the sensor signal is independent of the grounding state. As a result, thereby provided is a capacitive sensor system (position sensor) in operation mode "absorption", which provides approximately equal results with grounded and non-grounded sensor electronics.

The receiving electrode Rx is designed such and arranged such relative to the transmitting electrodes +Tx, −Tx, respectively, that a capacitive coupling substantially only exists with one of the transmitting electrodes +Tx or −Tx. In an alternative embodiment of the sensor system it also is feasible that the transmission current by means of a respective sensor layout and bay means of a respective isolating layer thickness is reduced such that also a sensor system only comprising one transmitting electrode +Tx may be constructed, which is largely independent of the grounding state.

When the grounding state (grounded or non-grounded) of the sensor system is known and largely constant, the sensor system also may be constructed comprising only one active transmitting electrode +Tx.

The electrode configuration of a capacitive sensor system according to various embodiments for detecting a position of an object relative to the electrode configuration substantially comprises two electrode arrangements:

1. one exposure detection electrode arrangement, and
2. one position detection electrode arrangement.

Figure 2A:
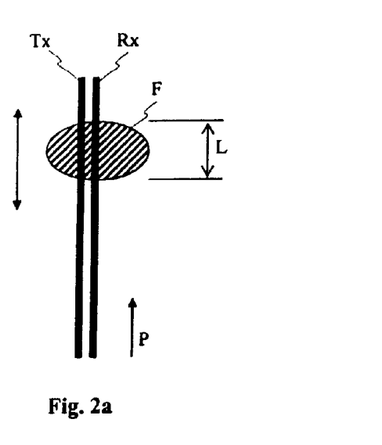
FIG. 2a shows an exposure detection electrode arrangement according to an embodiment for detecting the exposure of the electrodes by an object, for example a finger.
Figure 2B:
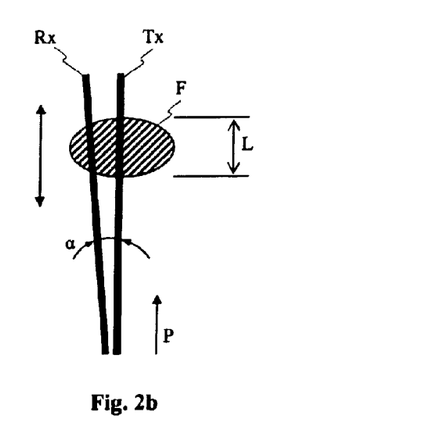
FIG. 2b shows a position detection electrode arrangement according to an embodiment for detecting the position of an object relative to the electrodes.

With respect to FIG. 2a and FIG. 2b these two electrode arrangements are described in more detail, before concrete embodiments of electrode configurations are described with respect to FIG. 3 to FIG. 6.

FIG. 2a shows an exposure detection electrode arrangement according to various embodiments for detecting the exposure of the electrodes by an object, for example a finger.

The exposure detection electrode arrangement comprises two electrodes Tx and Rx, wherein the electrodes Tx, Rx substantially are arranged parallel with respect to each other. The two electrodes Tx, Rx may have the same electrode width. By means of the exposure detection electrode arrangement the electrode length and electrode surface area covered by the finger F may be detected independent of the position of the finger F. Thereby, the sensor signal substantially is proportional to the covered electrode length and electrode surface area, respectively. The electrodes Tx, Rx may be covered with a layer of isolating material.

When the finger F touches the electrodes Tx, Rx or the surface of the isolating material the coupling capacity between the transmitting electrode Tx and the receiving electrode Rx changes, wherein the variation of the coupling capacity is independent of the position in which the finger approaches the electrodes Tx, Rx and at which position the finger contacts the electrodes Tx, Rx, respectively.

When the sensor device according to various embodiments is operated in the absorption mode, then the coupling capacity between the transmitting electrode Tx and the receiving electrode Rx changes and decreases, respectively, according to the following rule:

$$\Delta C_1 = K1*L \qquad \text{(formula 1)}$$

wherein K1 is a proportionality factor and L is the length of the exposure, so that applies $\Delta C_1 \sim L$ ($\Delta C_1$ is proportional to length L).

The detection of the exposure may also be provided for to switch the sensor device from a first operating mode into a second operating mode, for example from a sleeping mode into an active mode. To do so, a predetermined threshold value may be provided, which has to be exceeded before a change of the operating mode is carried out. For example, the threshold value may include a minimum covering and/or a minimum duration of an exposure.

FIG. 2b shows a position detection electrode arrangement according to various embodiments for detecting the position of an object relative to the electrodes.

The position detection electrode arrangement comprises two electrodes Tx and Rx, wherein the electrodes Tx, Rx substantially are arranged in an acute angle α relative to one another.

The two electrodes Tx, Rx may have the same electrode width. By means of the position detection electrode arrangement the position P of the finger F relative to the electrodes may be detected depending on the electrode length and electrode surface area, respectively, covered by the finger F. Thereby, the sensor signal substantially is proportional to the covered electrode length and electrode surface area, respectively, as well as substantially proportional to the position P of the finger F. The electrodes Tx, Rx may be covered with a layer of isolating material.

When the finger F touches the electrodes Tx, Rx or the surface of the isolating material, respectively, the coupling capacity between the transmitting electrode Tx and the receiving electrode Rx at the respective position changes.

When the sensor device according to various embodiments is operated in absorption mode, then in the position detection electrode arrangement the coupling capacity between the transmitting electrode Tx and the receiving electrode Rx changes and reduces, respectively, according to the following rule:

$$\Delta C_2 = K2*P*L \qquad \text{(formula 2)}$$

wherein K2 is a proportionality factor, P is the position of the finger F relative to the electrodes, and L is the length of the exposure, so that applies $\Delta C_2 \sim L*P$ ($\Delta C_2$ is proportional to length L as well as to P).

The position is calculated from the quotient $\Delta C_2/\Delta C_1 = P*K2/K1$. The result of the calculation itself here is independent of the exposure. This means that the position is detected and determined, respectively, in a correct manner independent of the width of the fingers covering the electrodes (finger of a child or finger of an adult), independent of the variation of the width of the covering (for example when the width of an object is changing while the object is moved relative to the electrodes), independent of the distance or a change in distance of the fingers covering the electrodes, and in particular independent of whether a glove is used.

Figure 3:
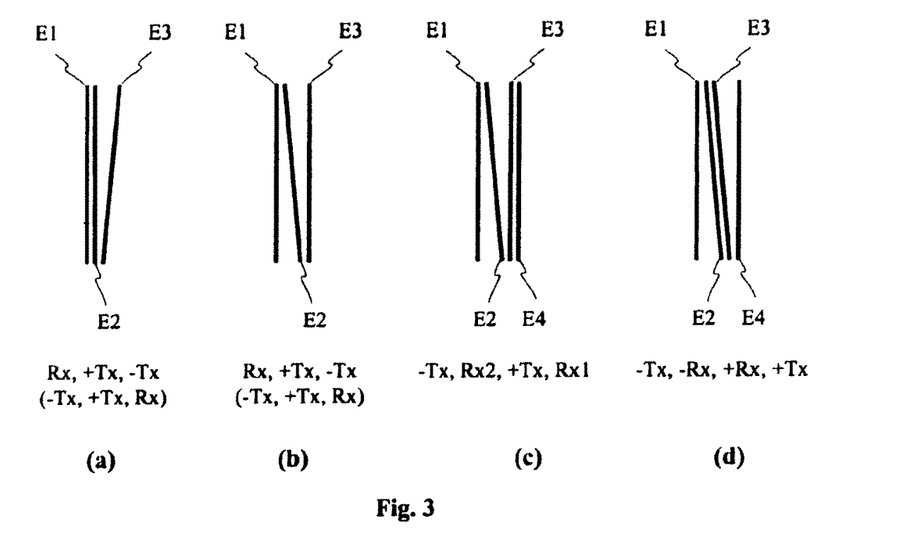
FIGS. 3(a) to 3(d) show different embodiments of an electrode configuration (layouts)
Figure 4:
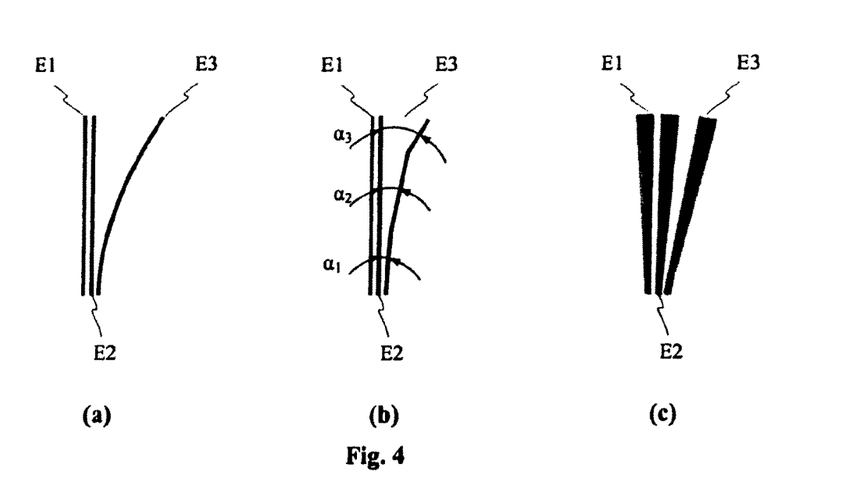
FIGS. 4(a) to 4(c) show embodiments of the electrodes of an electrode configuration.

FIG. 3 (a) to FIG. 3 (d) show electrode configurations according to various embodiments, which each comprise at least one position detection electrode arrangement.

FIG. 3 (a) shows an electrode configuration according to various embodiments, which is composed of an exposure detection electrode arrangement and a position detection electrode arrangement. By means of the exposure detection electrode arrangement the exposure (length and surface area, respectively, of the exposure) is detected. By means of the position detection electrode arrangement the position of a finger F is detected relative to the electrode configuration.

The exposure detection electrode arrangement is formed by the electrodes E1 and E2. The position detection electrode arrangement is formed by the electrodes E2 and E3. Therefore, the electrode E2 constitutes a common electrode for the exposure detection electrode arrangement and the position detection electrode arrangement.

In a first measurement the exposure by a finger F is detected. In this connection, the electrode E1 is operated as receiving electrode Rx and the electrodes E2 and E3 each are operated as transmitting electrodes Tx, wherein the electrode E3 is loaded with a generator signal, which is inverse with respect to the generator signal, which is applied to electrode E2.

In a second measurement the position of the finger F relative to the electrode configuration is detected, wherein in calculating the position the exposure is accounted for (see formula 2 above). In the second measurement the electrodes E1 and E2 each are operated as a transmitting electrode and the electrode E3 is operated as receiving electrode. The electrode E1 is loaded with a generator signal, which is inverse with respect to the generator signal, which is applied to electrode E2. It may be provided for that the position only then is detected and determined, respectively, when the exposure exceeds a predetermined threshold value. In doing so, the energy consumption may be lowered significantly, which in particular can be advantageous in devices and handheld devices, respectively, operated by means of a battery or a rechargeable battery.

FIG. 3 (b) shows an electrode configuration according to various embodiments, which is composed of two position detection electrode arrangements. The first position detection electrode arrangement is formed by electrodes E1 and E2, wherein the electrode E1 is arranged in an acute angle with respect to electrode E2. The second position detection electrode arrangement is formed by the electrodes E2 and E3, wherein the electrode E3 is arranged in an acute angle with respect to electrode E2. Therefore, electrode E2 forms a common electrode for the two position detection electrode arrangements.

With the electrode configuration of FIG. 3 (b) two measurements have to be carried out for detecting the position and the exposure.

In a first measurement the electrode E1 is operated as receiving electrode and the electrodes E2 and E3 are operated as transmitting electrodes. The generator signal applied to electrode E2 is inverse with respect to the generator signal applied to electrode E3. By means of the first measurement a first position POS1 is measured.

In a second measurement the electrode E3 is operated as receiving electrode and the electrodes E2 and E1 are operated as transmitting electrodes. The generator signal applied to electrode E2 is inverse with respect to the generator signal applied to electrode E1. By means of the second measurement a second position POS2 is measured.

The exposure results from the rule exposure=POS1+POS2.

The position of the finger relative to the electrode configuration results from the rule $POS_{Finger}$=POS1−POS2.

FIG. 3 (e) shows an electrode configuration according to various embodiments, which is composed of two position detection electrode arrangements and one exposure detection electrode arrangement.

The first position detection electrode arrangement is formed by electrode E1 and E2, wherein electrode E1 is arranged in an acute angle with respect to electrode E2. The second position detection electrode arrangement is formed by electrodes E2 and E3, wherein electrode E3 is arranged in an acute angle with respect to electrode E2. Therefore, electrode E2 forms a common electrode for the two position detection electrode arrangements.

The exposure detection electrode arrangement is formed by electrodes E3 and E4, wherein electrode E3 substantially is arranged parallel to electrode E4. Therefore, electrode E3 forms a common electrode for the second position detection electrode arrangement and the exposure detection electrode arrangement.

In a first measurement the exposure of the electrode configuration by a finger F is detected. In this connection, electrode E4 is operated as receiving electrode Rx and electrodes E1 and E3 each are operated as transmitting electrodes Tx, wherein electrode E3 is loaded with a generator signal, which is inverse with respect to the generator signal, which is applied to electrode E1. In doing so, the detection of the exposure substantially is carried out independent of the grounding conditions of the sensor system.

In a second measurement the position of the finger F relative to the electrode configuration is detected, wherein during the calculation of the position the exposure is accounted for (see formula 2 above). In the second measurement the electrodes E1 and E3 each are operated as transmitting electrodes and the electrode E2 is operated as receiving electrode. The electrode E1 is loaded with a generator signal, which is inverse with respect to the generator signal, which is applied to electrode E3. It may be provided for that the position only then is detected and determined, respectively, when the exposure exceeds a predetermined threshold value. In doing so, the energy consumption may be reduced significantly, which in particular can be advantageous in devices and handheld devices, respectively, operated by a battery or a rechargeable battery.

The electrode configuration shown in FIG. 3 (c) may have the advantage over the electrode configuration shown in FIG. 3 (a) that the transmitting electrodes E1 and E3 do not have to be switched in between the measurement of the exposure and the measurement of the position. A further advantage over the electrode configuration of FIG. 3 (a) can be that the measurement signal (sensor signal) shows a larger amplitude during the measurement of the position and has a better linearity with respect to the position.

FIG. 3 (d) shows an electrode configuration according to various embodiments, which is composed of two position detection electrode arrangements.

The first position detection electrode arrangement is formed by electrodes E1 and E2, wherein electrode E1 is arranged in an acute angle with respect to electrode E2. The second position detection electrode arrangement is formed by electrodes E3 and E4, wherein electrode E3 is arranged in an acute angle with respect to electrode E4. In addition, electrode E2 here substantially is arranged parallel to electrode E3. However, electrode E2 may also be arranged in an acute angle with respect to electrode E3.

The electrodes E1 and E4 are operated as transmitting electrodes −Tx and +Tx, respectively, during the measurement of the exposure as well as also during the measurement of the position.

The electrodes E2 and E3 are operated as receiving electrodes −Rx and +Rx, respectively, during the measurement of the exposure as well as also during the measurement of the position. The electrode E1 is loaded with a generator signal, which is inverse with respect to the generator signal, which is applied to electrode E4.

The exposure of the electrode configuration is determined by means of calculating a difference of the sensor signals tapped at the receiving electrodes E3 and E2 (+Rx and −Rx, respectively), i.e. exposure=(+Rx)−(−Rx). By calculating the difference the immunity to interference is improved for interference signals, which couple into the receiving electrodes E2 and E3 having the same phase.

The position of a finger relative to the electrode configuration is determined by summing the sensor signals tapped at the receiving electrodes E3 and E2 (+Rx and −Rx, respectively), i.e. position=(+Rx)+(−Rx).

The activation of the electrodes of the electrode configuration described with respect to FIG. 3 (a) to FIG. 3 (d) is summarized in the following table:

TABLE 1

| Layout | Measurement | E1 | E2 | E3 | E4 | Result |
|---|---|---|---|---|---|---|
| FIG. 3(a) | 1 | Rx | +Tx | −Tx | — | exposure |
|  | 2 | −Tx | +Tx | Rx | — | position |
| FIG. 3(b) | 1 | Rx | +Tx | −Tx | — | POS1 |
|  | 2 | −Tx | +Tx | Rx | — | POS2 |
| FIG. 3(c) | 1 | −Tx | — | +Tx | Rx | exposure |
|  | 2 | −Tx | Rx | +Tx | — | position |
| FIG. 3(d) | 1 | −Tx | −Rx | +Rx | +Tx | Exposure = |

TABLE 1-continued

| Layout | Measurement | E1 | E2 | E3 | E4 | Result |
|---|---|---|---|---|---|---|
| | 2 | −Tx | −Rx | +Rx | +Tx | (+Rx) − (−Rx) Position = (+Rx) + (−Rx) |

Exposure = POS1 + POS2
Position = POS1 − POS2

By means of the inversely activated transmitting electrodes (−Tx and +Tx) it is accomplished that the sensor system is independent of the concrete grounding conditions of the sensor system.

The absorption effect substantially takes place between the electrodes Tx/Rx arranged adjacent to each other. The distance of the second Tx electrode to the Rx electrode is larger than the distance of the first Tx electrode to the Rx electrode, so that the effect of the second Tx electrode on the Rx electrode and on the absorption effect, respectively, is neglectably small (and because of the shielding effect of the first Tx electrode).

In FIG. 2a to FIG. 3 (d) the electrodes of the respective electrode configuration are shown as lines and as thin and substantially rectangular electrodes, respectively.

According to various embodiments it is also feasible that all or some of the electrodes are formed in a curved manner as shown in FIG. 4a, for example to linearize the position dependency of the sensor signals or to create a predefined different position dependency. Furthermore it is feasible that all or some of the electrodes are formed in a buckled manner, so that the individual segments of an electrode each have a different acute angle with respect to the adjacent electrode as shown in FIG. 4b.

The electrodes also may be configured comprising differing width or a width varying along the length as shown in FIG. 4c, by means of which substantially the coupling capacity to the finger is influenced. This again influences the ground dependency of the sensor system (Tx to finger) and also the disturbing signal interference of the system (finger to Rx). For an optimal independence from ground the coupling capacities from +Tx to the hand and from −Tx to the hand are equal in size. This may be realized by means of an identical electrode width of +Tx and −Tx.

Figure 5:
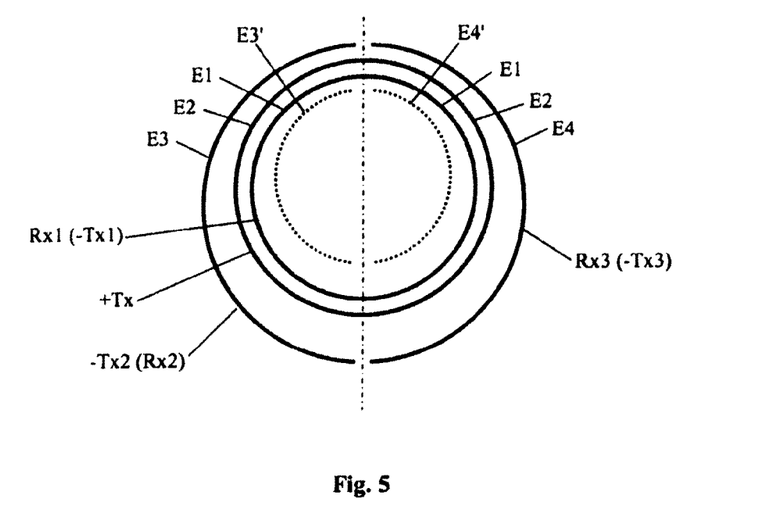
FIG. 5 shows an electrode configuration, wherein the electrodes substantially are configured circular and semi-circle-shaped, respectively.

FIG. 5 shows an electrode configuration according to various embodiments in which the electrodes substantially are configured circular and circular arc shaped, respectively.

The electrode configuration shown in FIG. 5 comprises four electrodes E1, E2, E3 and E4, wherein the electrodes E1 and E2 are formed uniformly (for example circular or ellipsoidal) and the electrodes E3 and E4 are formed in a curved manner (for example circular arc shaped, semicircle shaped or spiral arc shaped). The circular shaped electrodes E1 and E2 substantially are arranged concentrically with respect to each other. The semicircle shaped electrodes E3 and E4 substantially are arranged excentric with respect to the circular shaped electrodes E1 and E2.

The concentric arrangement of the circular shaped electrodes E1 and E2 substantially corresponds to the parallel arrangement of the electrodes of the electrode configurations shown in FIG. 2a and FIG. 3. The electrodes E1 and E2 shaped in a circular manner and arranged concentrically with respect to one another thereby form an exposure detection electrode arrangement by means of which the exposure may be detected and measured, respectively.

The excentric arrangement of the semi-circular shaped electrodes E3 and E4 relative to the electrodes E1 and E2, respectively, substantially corresponds to the acute angle arrangement of the electrodes of the electrode configurations shown in FIG. 2b and FIG. 3. The electrodes E3 and E4 shaped in a semi-circular manner and arranged excentric with respect to the electrodes E1 and E2 in each case together with the electrode E2 form a position detection electrode arrangement by means of which the position of an object relative to the electrode configuration may be detected and measured, respectively.

With respect to FIG. 3(a) to FIG. 3(d) it has been described how the exposure and/or the position may be detected and measured, respectively.

In FIG. 5 the semi-circular shaped electrodes E3 and E4 have a larger radius than the outermost of the two circular shaped electrodes E1 and E2. Alternatively, the semi-circular shaped electrodes also may have a smaller radius than the inner one of the two circular shaped electrodes E1 and E2. In FIG. 5 semi-circular shaped electrodes, which have a smaller radius than the inner one of the two circular shaped electrodes E1 and E2 are shown with the reference numerals E3' and E4'.

In both cases it can be advantageous, but not absolutely required, to arrange the semi-circular shaped electrodes E3 and E4 and E3' and E4', respectively, such in a manner relative with respect to the circular shaped electrodes E1 and E2 that they do not intersect the circular shaped electrodes E1 and E2.

The electrode arrangement shown in FIG. 5 may be used for implementing a rotary encoder or a control dial (also known as wheel), for example in order to implement a loudness control in a music playing device. For example, in order to operate such a loudness control the thumb may be put onto the electrode configuration and may be moved continuously in circles, i.e. along the electrodes.

In doing so, by means of the electrodes E1 and E2 arranged concentrically with respect to each other the exposure is detected and measured, respectively, independent of the position and across 360°.

The position is detected and measured, respectively, with the help of the two semi-circular shaped electrodes E3 and E4 as well as with the help of the circular shaped electrode E1 or E2, wherein the position between 0° and 180° is detected using the electrode E3 and the position between 180° and 360° is detected using the electrode E4. In doing so, an unambiguous measurement of the angle position as well as the detection of a continuous "turning" are provided.

The layout shown in FIG. 5 corresponds to the layout shown in FIG. 3(a). The layouts shown in FIG. 3(b) to FIG. 3(d) accordingly also may be implemented using circular shaped and semi-circular shaped electrodes.

Figure 6:
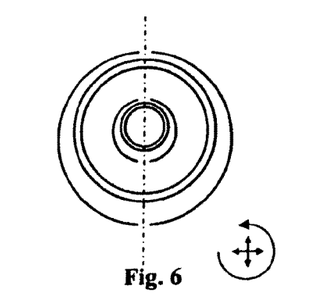
FIG. 6 shows a further embodiment of an electrode configuration comprising electrodes substantially configured circular and circular arc-shaped, respectively.

FIG. 6 shows a further embodiment of an electrode configuration comprising substantially circular shaped and semi-circular shaped electrodes, respectively. The electrode configuration shown in FIG. 6 substantially comprises at least two electrode configurations according to FIG. 5 arranged into each other. By means of arranging the two electrode configurations into each other a two-dimensional input becomes feasible: a) the detection along the respective electrode configurations (control dial) and b) the detection of the position along an X and Y axis.

Figure 7:
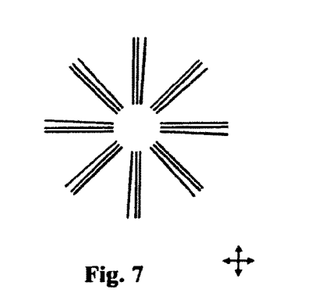
FIG. 7 shows a further embodiment of an electrode configuration.

FIG. 7 shows a further exemplary embodiment of an electrode configuration, which substantially consists of eight electrode configurations as shown in FIG. 3(a) to FIG. 3(d). The electrode configurations each are arranged in an angle of 45° with respect to each other. Of course, also more or less than eight electrode configurations may be provided. Also, the angle may vary. For example six electrode configurations may be provided, which each are arranged in an angle of about 30° relative to one another. Advantageously, using the electrode layout shown in FIG. 7 a detection of the position along an X and Y axis is feasible.

The activation of the electrodes of the electrode configurations according to various embodiments preferably is not carried out individual, but the electrodes of the electrode configurations are connected to each other such that a reduction of the connections is feasible without interfering with an unambiguous evaluation of the signals.

FIG. 8 to FIG. 11 each show basic circuit diagrams of the electrode configurations (layouts) according to various embodiments shown in FIG. 3(a) to FIG. 3(d).

A square wave generator with, for example, 100 kHz activates two driver components at the outputs of which then generator signals +Tx and −Tx, respectively, shifted in phase by 180°, are present, which are applied to the transmitting electrodes (see table 1 above). The measurement signal—a capacitive current or alternating current, respectively, —is tapped at the receiving electrodes, fed to an analog frontend AFE and amplified and conditioned in the analog frontend AFE, for example high- and/or low-pass filtered. The amplified and conditioned signal is digitized in an analog to digital converter A/D and processed in a digital signal processing not shown here in detail.

The electrode configurations according to FIG. 3(a) and FIG. 3(b) have electrodes, which are operated as transmitting or receiving electrodes. At least two measurements are provided for (see table 1 above), for which the respective electrodes then are switched to the respective transmitter and receiver, respectively.

All of the circuitries shown here are configured such that always two transmitting electrodes are activated at the same time, namely by signals shifted in phase with respect to each other by 180° (i.e. inverted).

Figure 8:
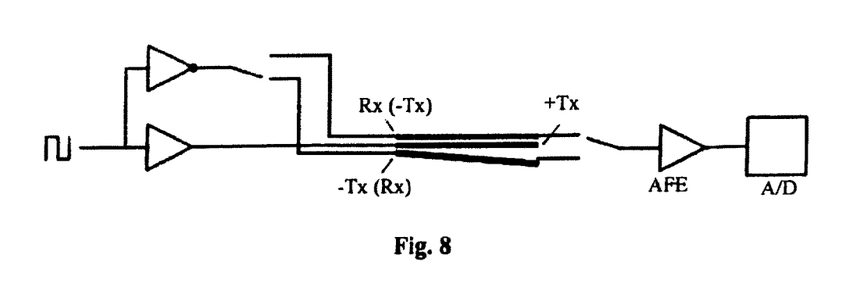
FIGS. 8 to 11 show basic circuit diagrams for the electrode configurations (layouts) shown in FIG. 3(a) to FIG. 3(d).

FIG. 8 shows a basic circuit diagram for the electrode configuration of FIG. 3(a). The electrode configuration shown in FIG. 3(a) may have the advantage that in the idle mode of the sensor system only one measurement (for detecting the exposure) has to be carried out in order to detect whether a user is approaching the sensor system. Starting from a predetermined minimum exposure (or another suitable threshold value) then a second measurement (for detecting the position) is carried out in order to calculate the position.

Figure 9:
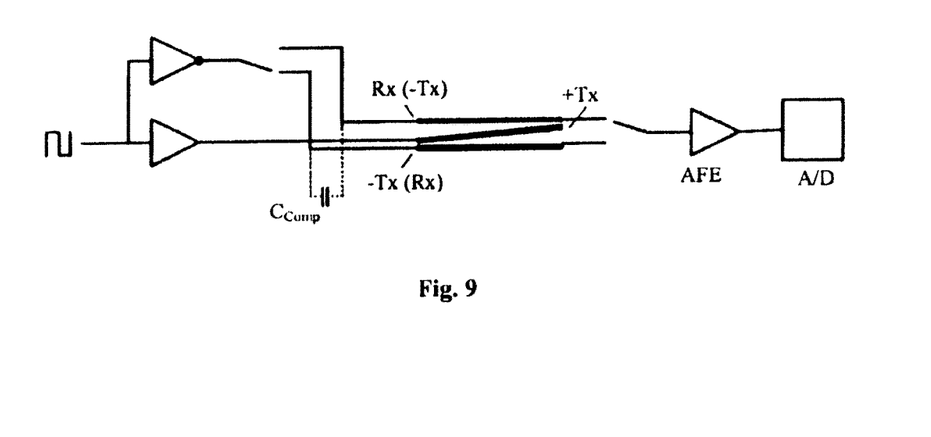

In the basic circuit diagram of FIG. 9, which may be provided for the electrode configuration of FIG. 3(b), a capacitor $C_{Comp}$ is provided between Rx and −Tx and between −Tx and Rx, respectively.

The capacitor $C_{Comp}$ may be realized in discrete form or in form of a conductor path coupling. In absolute value, the capacitor $C_{Comp}$ approximately corresponds to the coupling capacity between Tx and Rx in the idle state of the sensor system. By means of providing the capacitor $C_{Comp}$ the measurement signal in the idle state of the sensor system becomes approximately zero, by means of which it is feasible to increase the amplification of the analog frontend AFE and thereby to increase the sensitivity of the sensor. Providing one or more respective capacities $C_{Comp}$ also is feasible in circuitry configured according to the basic circuit diagrams according to FIG. 8, FIG. 10 and FIG. 11.

Figure 10:
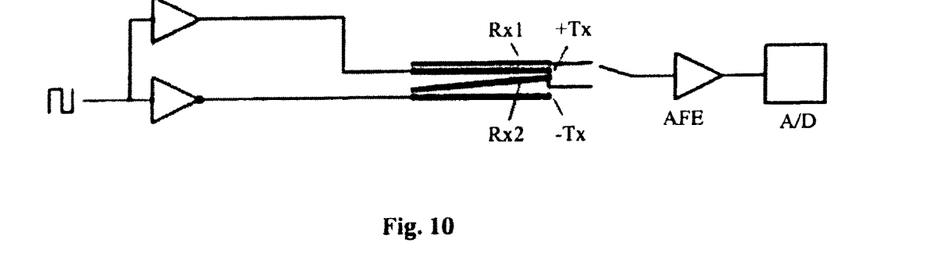

FIG. 10 shows a basic circuit diagram for the electrode configuration of FIG. 3(c).

Figure 11:
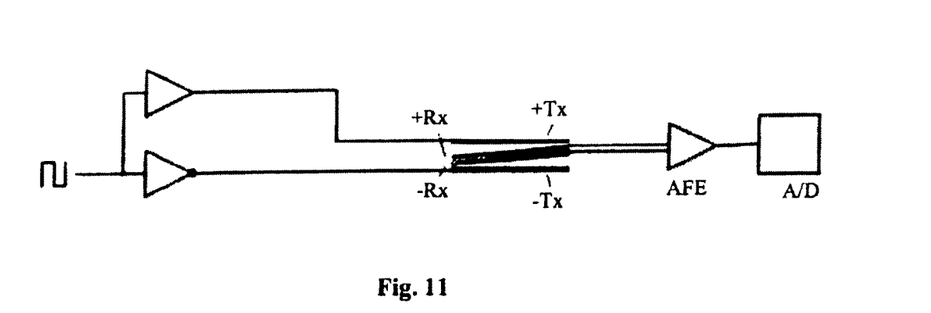

FIG. 11 shows a basic circuit diagram for the electrode configuration of FIG. 3(d).

The above described capacitive sensor systems and electrode configurations as well as modifications according to various embodiments therefrom may be provided in electric devices, in particular electric handheld devices, in order to equip the handheld device with additional user interfaces and man-machine interfaces, respectively. The electric device and electric handheld device, respectively may be a smart phone, a mobile radio unit, a computer mouse, a device remote control, a digital camera, a game controller, a mobile mini-computer, a tablet-PC, a dictating machine, a media player or the like.

What is claimed is:

1. A method for detecting a position of an object relative to an electrode configuration comprising at least three electrodes, wherein a longitudinal center axis of a first electrode is arranged substantially parallel with respect to a longitudinal center axis of a second electrode, a longitudinal center axis of a third electrode is arranged in an acute angle relative to the longitudinal center axis of the first electrode, the method comprising:

during a first measurement, operating the second electrode as a receiving electrode and loading the first electrode with a first generator signal and the third electrode with a second generator signal for determining coverage of the electrode configuration by the object, wherein a first measurement signal is received from the second electrode, which is representative for a first coupling capacity between the second electrode and the first electrode, during a second measurement, operating the third electrode as a receiving electrode and loading the first electrode with the first generator signal and the second electrode with the second generator signal for determining the position, wherein at the third electrode a second measurement signal is received, which is representative for a second coupling capacity between the third electrode and the first electrode, and wherein the position is determined from the ratio of a change of the second coupling capacity to a change of the first coupling capacity due to a presence of the object.

2. The method of claim 1, wherein the second generator signal is inverse with respect to the first generator signal.

3. The method of claim 1, wherein prior to determining the position it is determined, whether the first coupling capacity falls below a predetermined value, wherein the position only then is determined, when the first coupling capacity falls below the predetermined value.

4. The method of claim 1, wherein the variation of the first coupling capacity is proportional to the coverage of the electrode configuration by the object independent of a position of the object along a length of the electrode configuration, and wherein the variation of the second coupling capacity is proportional to the product of coverage and position of the object relative to the electrode configuration.

5. The method of claim 1, wherein the variation of the first coupling capacity and the variation of the second coupling capacity each are determined as the variation based on the respective coupling capacity in the basic state of the electrode configuration.

6. An electrode configuration for a capacitive sensor system for detecting a position of an object relative to the electrode configuration, wherein the electrode configuration comprises:

a first position detection electrode arrangement with a first electrode and a second electrode, wherein the first electrode is operable as a transmitting electrode and the second electrode is operable as a receiving electrode, wherein a longitudinal center axis of the first electrode is arranged in an acute angle relative to a longitudinal center axis of the second electrode, and wherein the first electrode is loaded with a first generator signal, and at least one exposure detection electrode arrangement, which comprises a third electrode and a fourth electrode, wherein the third electrode is operated as a transmitting electrode and is loaded with a second generator signal which is inverse to the first generator signal and wherein a longitudinal center axis of the third electrode is arranged in parallel with the longitudinal center axis of the first electrode.

7. The electrode configuration of claim 6, wherein the third electrode is arranged in parallel with the fourth electrode, wherein the third electrode is operated as a transmitting electrode and the fourth electrode is operated as a receiving electrode.

8. The electrode configuration of claim 6, wherein the third electrode is arranged in an acute angle with respect to the fourth electrode, wherein the third electrode is operated as a receiving electrode and the fourth electrode is operated as a transmitting electrode.

9. The electrode configuration of claim 6, further comprising a second position detection electrode arrangement, which comprises a fifth electrode and a sixth electrode, wherein the fifth electrode is arranged in an acute angle relative to the sixth electrode.

10. The electrode configuration of claim 9, wherein the second electrode of the first position detection electrode arrangement substantially is arranged parallel to the fifth electrode of the second position detection electrode arrangement.

11. The electrode configuration of claim 9, wherein the sixth electrode of the second position detection electrode arrangement is formed by the second electrode of the first position detection electrode arrangement, wherein the fifth electrode may be operated as transmitting electrode and may be loaded with the first generator signal.

12. The electrode configuration of claim 9, wherein the second electrode of the first position detection electrode arrangement substantially is arranged concentrically with respect to the fifth electrode of the second position detection electrode arrangement.

13. The electrode configuration of claim 9, wherein the third electrode substantially is arranged parallel to the fourth electrode.

14. The electrode configuration of claim 9, wherein the second electrode or the fourth electrode or the sixth electrode may be loaded with a second generator signal and wherein the electrodes not loaded with a generator signal may be operated as receiving electrodes.

15. The electrode configuration of claim 14, wherein the second generator signal is formed inverse with respect to the first generator signal.

16. The electrode configuration of claim 14, wherein the electrode loaded with the first or second generator signal is coupled with at least one receiving electrode via a coupling capacity, wherein the coupling capacity is configured as a discrete capacitor or as a conductor path coupling.

17. An electrode configuration for a capacitive sensor system for detecting a position of an object relative to the electrode configuration, wherein the electrode configuration comprises:

a first electrode, a second electrode and a third electrode, wherein the first electrode is operable as a transmitting electrode and the second electrode is operable as a receiving electrode, wherein a longitudinal center axis of the first electrode is arranged in parallel with respect to a longitudinal center axis of the second electrode, and a longitudinal center axis of the third electrode is arranged in an acute angle relative to the longitudinal center axis of the first electrode, and a control circuit configured to operate the second electrode as a receiving electrode and to load the first electrode with a first generator signal and the third electrode with a second generator signal during a first measurement for determining coverage of the electrode configuration by the object, wherein a first measurement signal is received from the second electrode, which is representative for a first coupling capacity between the second electrode and the first electrode, operate the third electrode as a receiving electrode and to load the first electrode with the first generator signal and the second electrode with the second generator signal during a second measurement for determining the position, wherein at the third electrode a second measurement signal is received, which is representative for a second coupling capacity between the third electrode and the first electrode, and wherein the control circuit determines the position from the ratio of a change of the second coupling capacity to a change of the first coupling capacity due to a presence of the object.

18. The electrode configuration of claim 17, wherein the second generator signal is inverse with respect to the first generator signal.

19. The electrode configuration of claim 17, wherein the control circuit is further configured prior to determining the position to determine, whether the first coupling capacity falls below a predetermined value, wherein the position only then is determined, when the first coupling capacity falls below the predetermined value.

20. The electrode configuration of claim 17, wherein the variation of the first coupling capacity is proportional to the coverage of the electrode configuration by the object, and wherein the variation of the second coupling capacity is proportional to the product of coverage and position of the object relative to the electrode configuration.

21. The electrode configuration of claim 17, wherein the variation of the first coupling capacity and the variation of the second coupling capacity each are determined as the variation based on the respective coupling capacity in the basic state of the electrode configuration.

22. A method for detecting a position of an object relative to an electrode configuration comprising at least three electrodes being at least partially ring shaped, wherein a first electrode is arranged substantially concentrically with respect to a second electrode, and a third electrode is arranged excentric relative to the first electrode, the method comprising:

during a first measurement, operating the second electrode as a receiving electrode and loading the first electrode with a first generator signal and the third electrode with a second generator signal for determining coverage of the electrode configuration by the object, wherein a first measurement signal is received from the second electrode, which is representative for a first coupling capacity between the second electrode and the first electrode, during a second measurement, operating the third electrode as a receiving electrode and loading the first electrode with the first generator signal and the second electrode with the second generator signal for determining the position, wherein at the third electrode a second measurement signal is received, which is representative for a second coupling capacity between the third electrode and the first electrode, and wherein the position is determined from the ratio of a change of the second coupling capacity to a change of the first coupling capacity due to a presence of the object.

23. The method of claim 22, wherein the second generator signal is inverse with respect to the first generator signal.

24. The method of claim 22, wherein prior to determining the position it is determined, whether the first coupling capacity falls below a predetermined value, wherein the position only then is determined, when the first coupling capacity falls below the predetermined value.

25. The method of claim 22, wherein the variation of the first coupling capacity is proportional to the coverage of the electrode configuration by the object, and wherein the variation of the second coupling capacity is proportional to the product of coverage and position of the object relative to the electrode configuration.

26. The method of claim 22, wherein the variation of the first coupling capacity and the variation of the second coupling capacity each are determined as the variation based on the respective coupling capacity in the basic state of the electrode configuration.

27. An electrode configuration for a capacitive sensor system for detecting a position of an object relative to the electrode configuration, wherein the electrode configuration comprises:
a first electrode and a second electrode, wherein the first electrode is operable as a transmitting electrode and the second electrode is operable as a receiving electrode, wherein the first electrode is arranged concentrically with respect to the second electrode, and a third electrode arranged excentrically relative to the first electrode, wherein the first, second, and third electrode are at least partially ring shaped;
and a control circuit configured to
operate the second electrode as a receiving electrode and to load the first electrode with a first generator signal and the third electrode with a second generator signal during a first measurement for determining coverage of the electrode configuration by the object, wherein a first measurement signal is received from the second electrode, which is representative for a first coupling capacity between the second electrode and the first electrode,
operate the third electrode as a receiving electrode and to load the first electrode with the first generator signal and the second electrode with the second generator signal during a second measurement for determining the position, wherein at the third electrode a second measurement signal is received, which is representative for a second coupling capacity between the third electrode and the first electrode, and
wherein the control circuit determines the position from the ratio of a change of the second coupling capacity to a change of the first coupling capacity due to a presence of the object.

28. The electrode configuration of claim 27, wherein the second generator signal is inverse with respect to the first generator signal.

29. The electrode configuration of claim 27, wherein the control circuit is further configured prior to determining the position to determine, whether the first coupling capacity falls below a predetermined value, wherein the position only then is determined, when the first coupling capacity falls below the predetermined value.

30. The electrode configuration of claim 27, wherein the variation of the first coupling capacity is proportional to the coverage of the electrode configuration by the object, and wherein the variation of the second coupling capacity is proportional to the product of coverage and position of the object relative to the electrode configuration.

31. The electrode configuration of claim 27, wherein the variation of the first coupling capacity and the variation of the second coupling capacity each are determined as the variation based on the respective coupling capacity in the basic state of the electrode configuration.

32. The electrode configuration according to claim 1, wherein each of the at least three electrodes has a rectangular shape.

33. The electrode configuration according to claim 6, wherein each of the first, second, third and fourth electrodes has a rectangular shape.

34. The electrode configuration according to claim 6, wherein each of the first, second, and third electrodes has a rectangular shape.

35. A method for detecting a position of an object relative to an electrode configuration comprising at least three electrodes, wherein a first electrode is arranged substantially parallel or concentrical with respect to a second electrode such that a capacitive coupling between the first and second electrode is independent with a position along a length of the first and second electrodes, and wherein a third electrode is arranged in an acute angle or excentrical relative to the first electrode such that a capacitive coupling between the first and third electrode is varying with respect to a position along a length of the first and third electrodes, the method comprising:
during a first measurement, operating the second electrode as a receiving electrode and loading the first electrode with a first generator signal and the third electrode with a second generator signal for determining coverage of the electrode configuration by the object, wherein a first measurement signal is received from the second electrode, which is representative for a first coupling capacity between the second electrode and the first electrode,
during a second measurement, operating the third electrode as a receiving electrode and loading the first electrode with the first generator signal and the second electrode with the second generator signal for determining the position, wherein at the third electrode a second measurement signal is received, which is representative for a second coupling capacity between the third electrode and the first electrode, and wherein the position is determined from the ratio of a change of the second coupling capacity to a change of the first coupling capacity due to a presence of the object.

36. The method of claim 35, wherein the second generator signal is inverse with respect to the first generator signal.

37. The method of claim 35, wherein prior to determining the position it is determined, whether the first coupling capacity falls below a predetermined value, wherein the position only then is determined, when the first coupling capacity falls below the predetermined value.

38. The method of claim 35, wherein the variation of the first coupling capacity substantially is proportional to the coverage of the electrode arrangement configuration by the object independent of a position of the object along a length of a respective electrode, and wherein the variation of the second coupling capacity substantially is proportional to the product of coverage and position of the object relative to the electrode configuration.

39. The method of claim 35, wherein the variation of the first coupling capacity and the variation of the second coupling capacity each are determined as the variation based on the respective coupling capacity in the basic state of the electrode configuration.

* * * * *